US007005377B2

(12) United States Patent
Ip et al.

(10) Patent No.: US 7,005,377 B2
(45) Date of Patent: Feb. 28, 2006

(54) BIMETAL LAYER MANUFACTURING METHOD

(75) Inventors: Hiu Fung Ip, San Jose, CA (US); Ellick Ma, San Jose, CA (US); Yan Ling Yu, Shanghai (CN); Ren Chong, Shanghia (CN); Ji-Wei Sun, Shanghai (CN)

(73) Assignee: BCD Semiconductor Manufacturing Ltd., Hamilton (BM)

( * ) Notice: Subject to any disclaimer, the term of this patent is extended or adjusted under 35 U.S.C. 154(b) by 60 days.

(21) Appl. No.: 10/851,177

(22) Filed: May 24, 2004

(65) Prior Publication Data

US 2005/0260852 A1    Nov. 24, 2005

(51) Int. Cl.
  *H01L 21/44*    (2006.01)
  *H01L 21/20*    (2006.01)
(52) U.S. Cl. .................. 438/669; 438/381; 438/624; 438/957
(58) Field of Classification Search ................ 438/669, 438/624, 626, 381, 957, 393
See application file for complete search history.

(56) References Cited

U.S. PATENT DOCUMENTS

| 6,300,682 | B1 * | 10/2001 | Chen | 257/758 |
| 6,384,442 | B1 * | 5/2002 | Chen | 257/298 |
| 6,597,032 | B1 * | 7/2003 | Lee | 257/303 |
| 6,730,573 | B1 * | 5/2004 | Ng et al. | 438/381 |

* cited by examiner

*Primary Examiner*—Michael Trinh
(74) *Attorney, Agent, or Firm*—Birch,Stewart,Kolasch & Birch,LLP

(57) ABSTRACT

A bimetal layer manufacturing method includes the procedure of: forming a first dielectric layer on the surface of a semiconductor substrate which has a first metal layer (conductive layer) of a selected pattern formed thereon; forming a SOG layer on the surface of the first dielectric layer; forming a second dielectric layer; forming required via holes on the foregoing layers until reaching the first metal layer; forming a linear layer from a dielectrics material through PECVD; removing unnecessary linear layer from selected locations through an anisotropic plasma etching process; finally forming a second metal layer on a selected surface of the linear layer where MIM capacitors to be formed, and forming connection plugs in the via openings without generating via hole poison.

6 Claims, 3 Drawing Sheets

BIMETAL LAYER MANUFACTURING METHOD

FIELD OF THE INVENTION

The present invention relates to a bimetal layer manufacturing method and particularly to a manufacturing method for fabricating a bimetal layer that also forms metal-insulation-metal (MIM) capacitors at the same time without incurring via hole poison.

BACKGROUND OF THE INVENTION

With the number of conductive wiring layers in the integrated circuit (IC) increases, metal layer structure consisting of two or more layers has gradually become a design adopted in many ICs. The metal layers usually are separated by inter-metal dielectrics (IMD). The metal conductive lines on the upper metal layer and the lower metal layer are connected by via holes. The conventional approach to interconnect in the metal is to deposit a dielectric layer on a substrate already having metal conductive lines formed thereon; next, form a vertical via opening in the dielectric layer through a selected via opening pattern; then form a conductive layer on the substrate that is made from material same as or different from the metal conductive lines; finally flatten the conductive layer and define the interconnection in the metal layers.

As the semiconductor elements are continuously miniaturized and the line width shrinks constantly, the distance between the metal lines also reduces constantly. As a result, the phenomenon of parasitic capacitor becomes more severe. The value of the dielectric constant of the IMD material becomes very important. The greater the dielectric constant of the IMD material, the more likely the parasitic capacitor occurs. The RC delay is even more serious, and circuit transmission speed decreases. By reducing the dielectric constant of the dielectric layer, the RC delay becomes lower and operation speed of elements may increase.

In the past, silicon dioxide film is being used as the dielectric material between the conductive lines. It has dielectric constant 3.9. In practice, the silicon dioxide film formed by chemical vapor deposition (CVD) has dielectric constant of 4.2, which is greater than the silicon dioxide film formed by thermal oxidization. For elements in the field of nanotechnology, the dielectric constant of such a silicon dioxide film cannot be further reduced. The resulting parasite capacitor effect affects signal transmission delay in the multi-layer conductive lines and signal cross talk incurred among them.

At present Spin-on-glass (SOG) is widely used in the semiconductor industry. It can form a lower dielectric constant, improved thermal stability, lower leakage current and has a simpler fabrication process. Thus it is a desired material for flattening or ditch filling in the semiconductor manufacturing process.

However, the SOG material and the dielectric layer of a lower dielectric constant now being used tend to form metal plug and result in poison in the downstream fabrication processes due to the dielectric layer of a lower dielectric constant mostly is porous and water absorbing and often contains moisture.

SUMMARY OF THE INVENTION

Therefore the primary object of the invention is to provide a method for manufacturing MIM capacitors that forms a dielectric layer of a low dielectric constant to reduce RC delay on the circuit, increase element speed, improve product quality and prevent metal poison.

Another object of the invention is to provide a selective via hole mask to determine which via holes exposed to the metal layer are to be connected to the metal in the later fabrication processes, or form an open circuit with the metal thereby to simplify product design and reduce change of fabrication process and improve the production yield.

Yet another object of the invention is to provide a via hole mask with selective option to mate the conductive connection of the downstream fabrication processes and enable the upstream fabrication processes sharable by many products.

The method according to the invention include: a. provide a semiconductor substrate which has a first metal layer of a defined pattern formed thereon, and form a first dielectric layer on the surface of the substrate and the first metal layer; b. form a SOG layer on the surface of the first dielectric layer; c. form a second dielectric layer, and form required via holes on the second dielectric layer, SOG layer and first dielectric layer until reaching the first metal layer to expose the first metal layer where the via holes are located; d. form a linear layer from a dielectrics material through plasma enhance chemical vapor deposition (PECVD) to cover the second dielectric layer and the surface around the via holes; e. define reserved areas on the linear layer through a photoresist layer and selectively remove the linear layer not required in the downstream processes through an anisotropic plasma etching process, and maintain the linear layer on the side wall of the via holes, and through a via hole mask to selectively determine which of the first metal layer exposed by the via holes to be connected to the metal in the downstream processes or form a metal open circuit in the downstream processes; f. finally form a required pattern on a second metal layer.

Thus a stacked and laminated structure consisting of the first metal layer, linear layer and second metal layer may be formed on a large via hole area to become a desired MIM capacitor. The linear layer on the side wall prevents the second metal layer from direct contact with the SOG and can eliminate the via hole poison problem.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
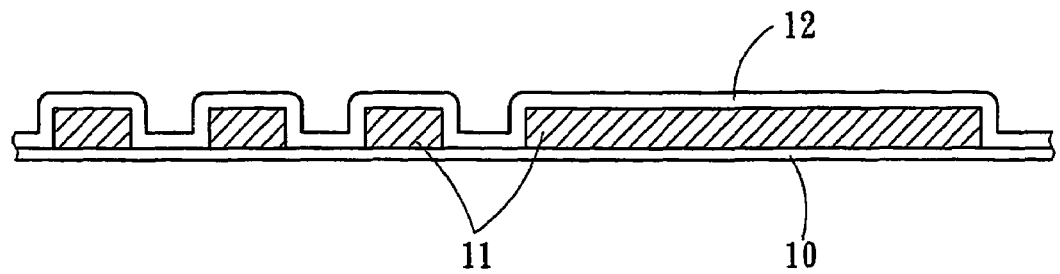
FIG. 1 is a sectional view for forming the first metal layer and the first dielectric layer of the invention.
Figure 2:
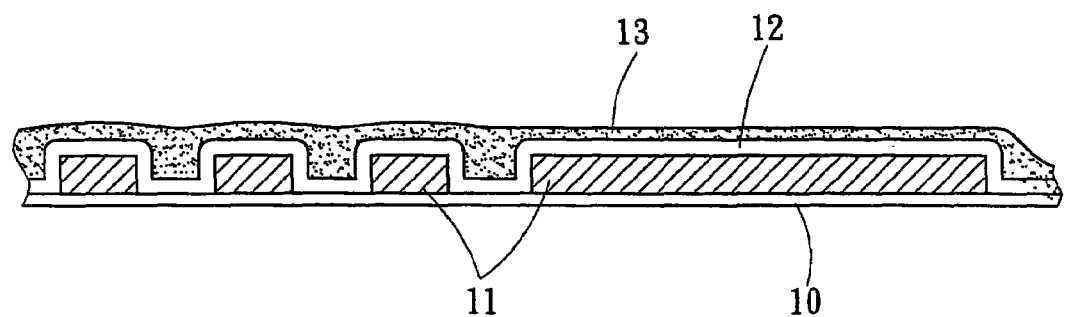
FIG. 2 is a sectional view for forming the SOG of the invention.
Figure 3:
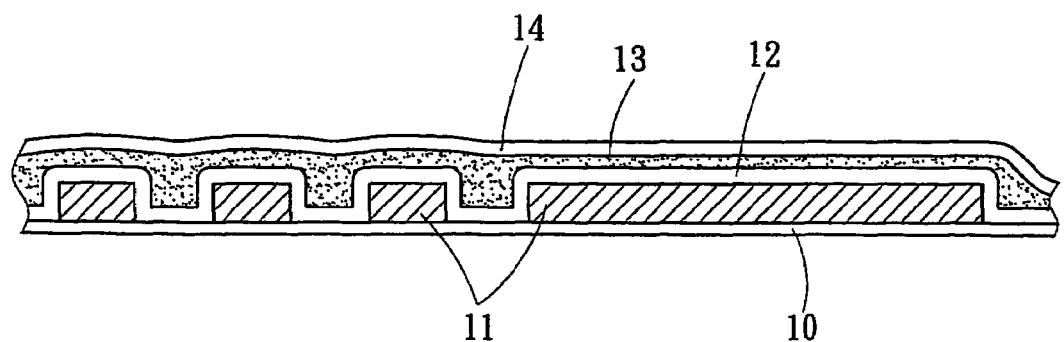
FIG. 3 is a sectional view for forming the second dielectric layer of the invention.
Figure 4:
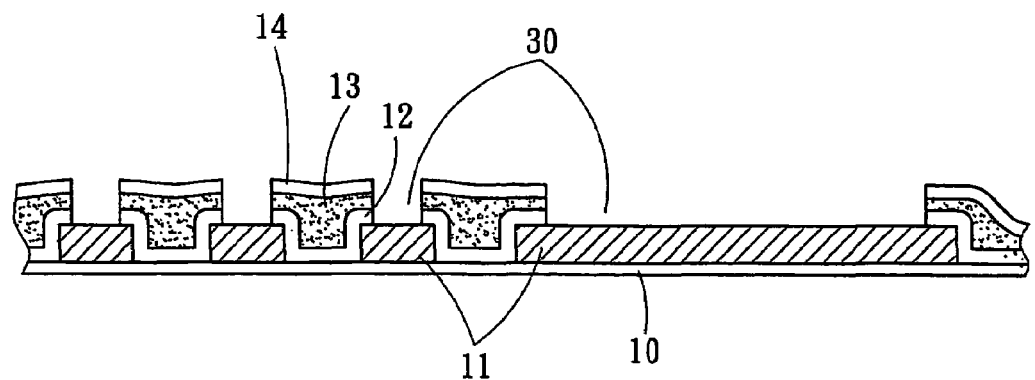
FIG. 4 is a sectional view for forming the via holes of the invention.
Figure 5:
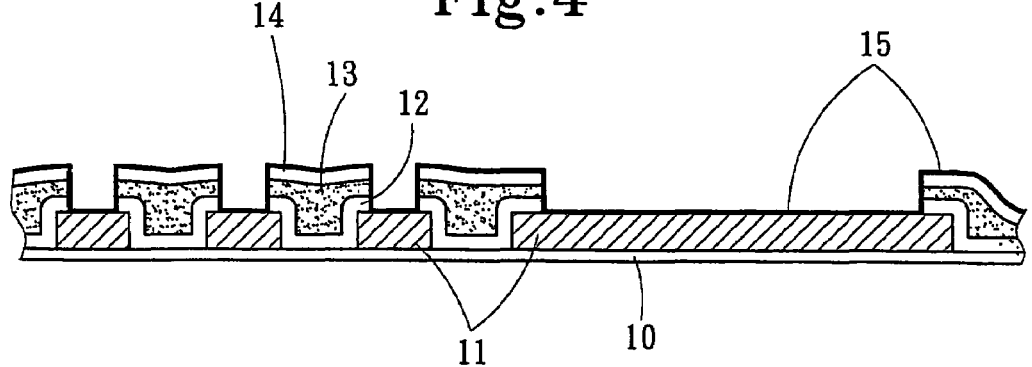
FIG. 5 is a sectional view for forming the linear layer of the invention.
Figure 6:
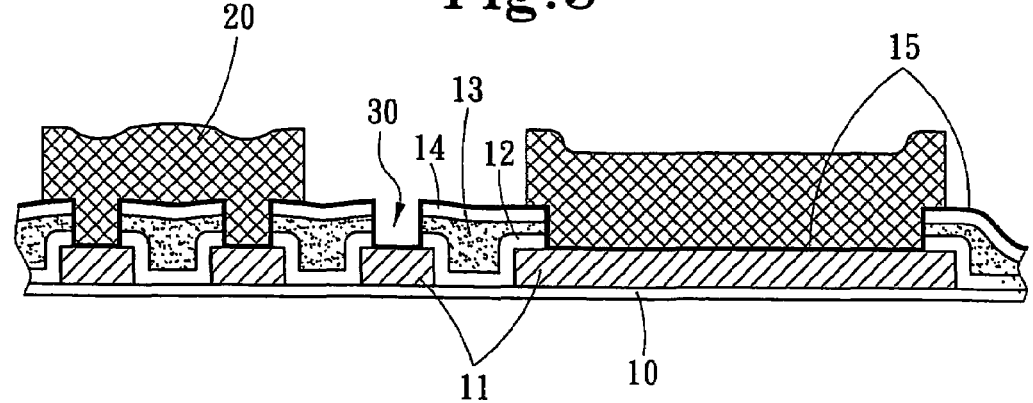
FIG. 6 is a sectional view for forming the photoresist layer of the invention.
Figure 7:
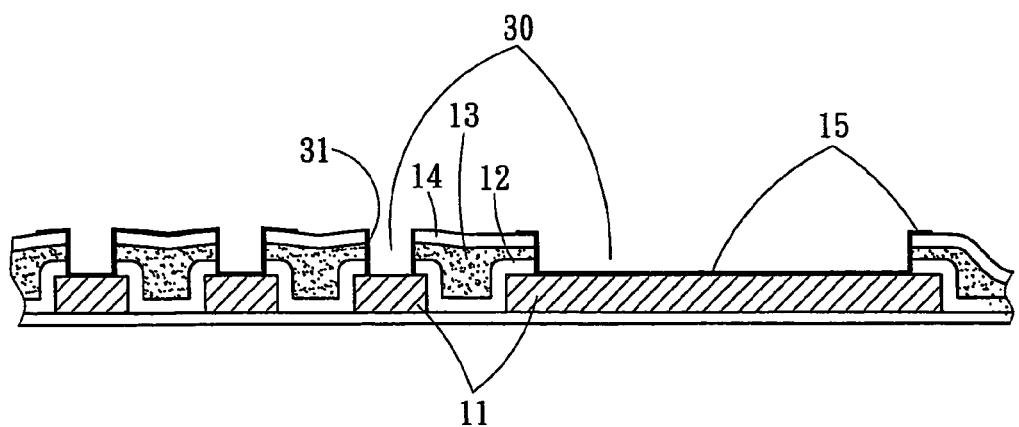
FIG. 7 is a sectional view for removing the photoresist layer of the invention.
Figure 8:
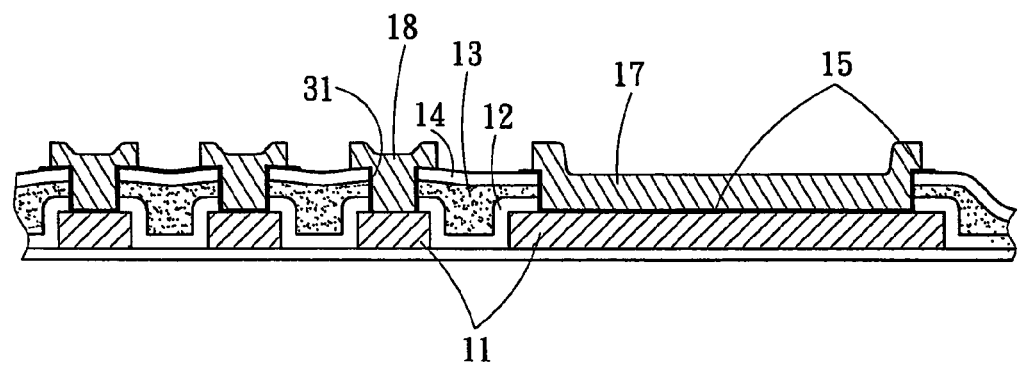
FIG. 8 is a sectional view for forming the second metal layer of the invention.

The bimetal layer manufacturing method according to the invention includes the procedure as follow:

a. Provide a semiconductor substrate 10 which has a first metal layer 11 of a selected pattern formed thereon, and form a first dielectric layer 12 to cover the surfaces of the first metal layer 11 and the substrate 10 as shown in FIG. 1. The first metal layer 11 is selected from the group consisting of aluminum, copper, aluminum copper alloy, and aluminum copper and silicon alloy.

b. Form a SOG layer 13 on the surface of the first dielectric layer 12 to flatten the indented first dielectric layer 12 caused by the pattern of the first metal layer 11 as shown in FIG. 2. The first dielectric layer 12 is selected from the group consisting of silicon dioxide, silicon nitride, nitrogen silicon oxide, phosphor silicon glass, and boron phosphor silicon glass.

c. Form a second dielectric layer 14 as shown in FIG. 3. Then form required via holes 30 on the second dielectric layer 14, SOG layer 13 and first dielectric layer 12 until reaching the first metal layer 11 to expose the first metal layer 11 where the via holes 30 are located as shown in FIG. 4. The second dielectric layer 14 has a low dielectric constant and is selected from the group consisting of silicon dioxide, silicon nitride, nitrogen silicon oxide, phosphor silicon glass, and boron phosphor silicon glass.

d. Form a linear layer 15 from a dielectrics material through plasma enhance chemical vapor deposition (PECVD) to cover the second dielectric layer 14 and the surface around the via holes 30, and the exposed first metal layer 11 as shown in FIG. 5. The dielectrics material for the linear layer 15 is selected from the group consisting of titanium nitride, tantalum nitride, and silicon nitride.

e. Define reserved areas on the linear layer 15 through a photoresist layer 20 as shown in FIG. 6. Selectively remove the linear layer 15 not required in the downstream processes through an anisotropic plasma etching process, and maintain the linear layer 15 on a side wall 31 of the via holes 30 as shown in FIG. 7. Through a via hole mask to selectively determine which of the first metal layer 11 exposed by the via holes 30 to be connected to the metal in the downstream processes or form a metal open circuit in the downstream processes. The upstream processes until this stage (start from forming a pattern on the first metal layer 11) can be commonly shared by the designs of many electronic elements, and can simplify product design, reduce change of fabrication process and improve production yield.

f. Finally form a second metal layer 17 with a required pattern as shown in FIG. 8.

Thus a stacked and laminated structure consisting of the first metal layer 11, linear layer 15 and second metal layer 17 may be formed on an area where a large via hole 30 is located to become a desired MIM capacitor. Although the material of the SOG layer 13 can fill crevices very well, it also has the disadvantage of absorbing moisture. Hence a connection plug 18 formed by the second metal layer 17 may be prevented from in direct contact with the SOG layer 13 by the linear layer 15 on the side wall 31. The via hole 30 thus formed does not contain SOG layer 13, thus does have the poison problem.

Figure 9:
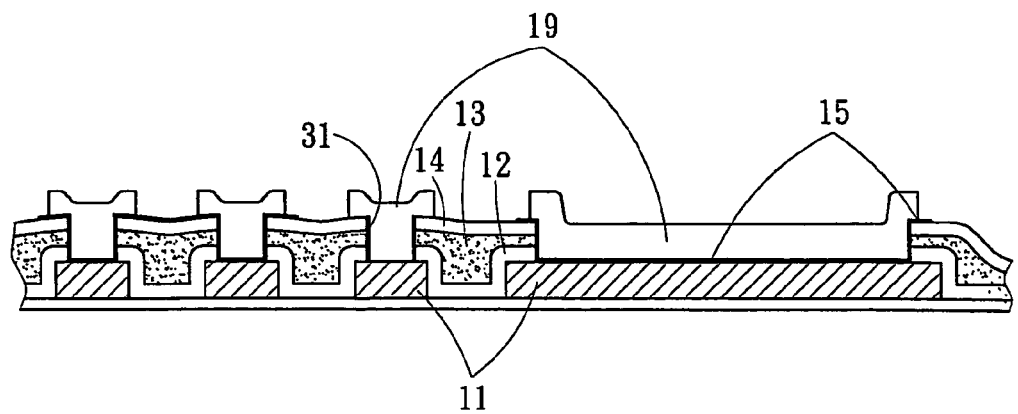
FIG. 9 is a sectional view for forming the anti-fuse layer of the invention.

The step f set forth above may also include forming a required pattern on an anti-fuse silicon layer 19 as shown in FIG. 9. Thereby through the step e, not only a MIM capacitor may be formed, a programmable logic consisting of metal fuse may also be made.

The anti-fuse silicon layer 19 usually is an open circuit. In the downstream fabrication processes, the anti-fuse silicon layer 19 of the open circuit may be selectively changed to short circuit, such as by laser heating or applying a bias voltage on the anti-fuse silicon layer 19 to change the resistance of the originally insulated anti-fuse silicon layer 19 and transform it to become conductive.

In summary, the invention can achieve the following effects:

1. The dielectrics material can prevent poison of via holes 30 from occurring.

2. The dielectrics material such as nitride may be used to form the linear layer 15 and the MIM capacitors.

3. Masking of the via holes 30 is selective and may be chosen for the conductive area in the downstream fabrication processes. Thus the upstream fabrication processes may be commonly shared by many products.

What is claimed is:

1. A bimetal layer manufacturing method, comprising:
   providing a semiconductor substrate which has a first metal layer of a selected pattern formed thereon and forming a first dielectric layer on the surfaces of the substrate and the first metal layer;
   forming a SOG layer on the surface of the first dielectric layer to flatten the surface thereof;
   forming a second dielectric layer and forming required via holes on the second dielectric layer, the SOG layer and the first dielectric layer until reaching the first metal layer;
   forming a linear layer through plasma enhance chemical vapor deposition (PECVD);
   removing selectively the linear layer not required in downstream fabrication processes through an anisotropic plasma etching process, and maintaining the linear layer on a side wall of the via holes; and
   forming a second metal layer pattern to obtain a desired MIM capacitor;
   wherein the second metal layer forms a connection plug which is prevented from direct contact with the SOG layer by the linear layer on the side wall.

2. The method of claim 1, wherein the first metal layer and the second metal layer are selected from the group consisting of aluminum, copper, aluminum copper alloy, and aluminum copper and silicon alloy.

3. The method of claim 1, wherein the first dielectric layer and the second dielectric layer are made from dielectric material of a low dielectric constant that are selected from the group consisting of silicon dioxide, silicon nitride, nitrogen silicon oxide, phosphor silicon glass, and boron phosphor silicon glass.

4. The method of claim 1, wherein the SOG layer is a nitride SOG layer.

5. The method of claim 1, wherein the linear layer is made from dielectric material.

6. The method of claim 5, wherein the dielectric material is selected from the group consisting of titanium nitride, tantalum nitride, and silicon nitride.

* * * * *